(12) United States Patent
Gravrand et al.

(10) Patent No.: US 9,640,701 B2
(45) Date of Patent: May 2, 2017

(54) METHOD OF MANUFACTURING A LOW NOISE PHOTODIODE

(71) Applicant: Commissariat a L'Energie Atomique et aux Energies Alternatives, Paris (FR)

(72) Inventors: Olivier Gravrand, Fontanil Cornillon (FR); Johan Rothman, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/919,130

(22) Filed: Oct. 21, 2015

(65) Prior Publication Data

US 2016/0111580 A1 Apr. 21, 2016

(30) Foreign Application Priority Data

Oct. 21, 2014 (FR) ...................................... 14 02360

(51) Int. Cl.
*H01L 21/00* (2006.01)
*H01L 31/00* (2006.01)
(Continued)

(52) U.S. Cl.
CPC ........ *H01L 31/1032* (2013.01); *H01L 21/266* (2013.01); *H01L 31/02966* (2013.01); *H01L 31/03042* (2013.01); *H01L 31/03529* (2013.01); *H01L 31/1035* (2013.01); *H01L 31/1832* (2013.01); *H01L 31/1844* (2013.01); *H01L 21/425* (2013.01); *Y02E 10/544* (2013.01)

(58) Field of Classification Search
CPC ............. H01L 31/1032; H01L 31/1844; H01L 31/1832; H01L 31/1035; H01L 21/266; H01L 21/0245; H01L 21/425; Y02E 10/544

See application file for complete search history.

(56) References Cited

U.S. PATENT DOCUMENTS

| | | |
|---|---|---|
| 4,791,467 A | 12/1988 | Amingual et al. |
| 9,165,967 B2 | 10/2015 | Gravrand et al. |

(Continued)

FOREIGN PATENT DOCUMENTS

| | | | | |
|---|---|---|---|---|
| JP | 2955983 | 10/1999 | | |
| WO | WO 2013/079446 | * | 6/2013 | ............. H01L 31/18 |

OTHER PUBLICATIONS

Hansen et al., "Energy gap versus alloy concentration and temperature in Hg1-CdxTe", Oct. 1982, I. Appl. Physics, vol. 53, No. 10, pp. 7099-7101.*

(Continued)

*Primary Examiner* — Nikolay Yushin
(74) *Attorney, Agent, or Firm* — Oblon, McClelland, Maier & Neustadt, L.L.P.

(57) ABSTRACT

A method of manufacturing a photodiode including a useful layer made of a semi-conductor alloy. The useful layer has a band gap value which decreases from its upper face to its lower face. A step of producing a first doped region forming a PN junction with a second doped region of the useful layer, said production of a first doped region including a first doping step, so as to produce a base portion; and a second doping step, so as to produce at least one protuberance protruding from the base portion and in the direction of the lower face.

14 Claims, 3 Drawing Sheets

(51) Int. Cl.
  H01L 31/103    (2006.01)
  H01L 31/18     (2006.01)
  H01L 21/266    (2006.01)
  H01L 31/0296   (2006.01)
  H01L 31/0304   (2006.01)
  H01L 31/0352   (2006.01)
  H01L 21/425    (2006.01)

(56) References Cited

U.S. PATENT DOCUMENTS

| | | | |
|---|---|---|---|
| 9,178,101 B2* | 11/2015 | Mollard | H01L 31/1032 |
| 2003/0071221 A1 | 4/2003 | Mitra | |
| 2007/0034898 A1 | 2/2007 | Tennant et al. | |
| 2008/0067620 A1 | 3/2008 | Rothman | |
| 2014/0319580 A1* | 10/2014 | Mollard | H01L 31/1032 |
| | | | 257/188 |
| 2014/0339570 A1 | 11/2014 | Mollard et al. | |
| 2014/0346539 A1 | 11/2014 | Mollard et al. | |
| 2015/0207027 A1 | 7/2015 | Boulard et al. | |

OTHER PUBLICATIONS

U.S. Appl. No. 14/402,020, filed Nov. 18, 2014, Francois Boulard et al.
U.S. Appl. No. 14/758,707, filed Jun. 30, 2015, Johan Rothman.
French Preliminary Search Report issued Sep. 21, 2015 in French Application 14 02360, filed on Oct. 21, 2014 (with English Translation of Category of Cited Documents).
J.M. Arias et al. "MBE HgCdTe Heterostructure p-on-n Planar Infrared Photodiodes", Journal of Electronic Materials, vol. 22, No. 8, 1993, 5 pages.

* cited by examiner

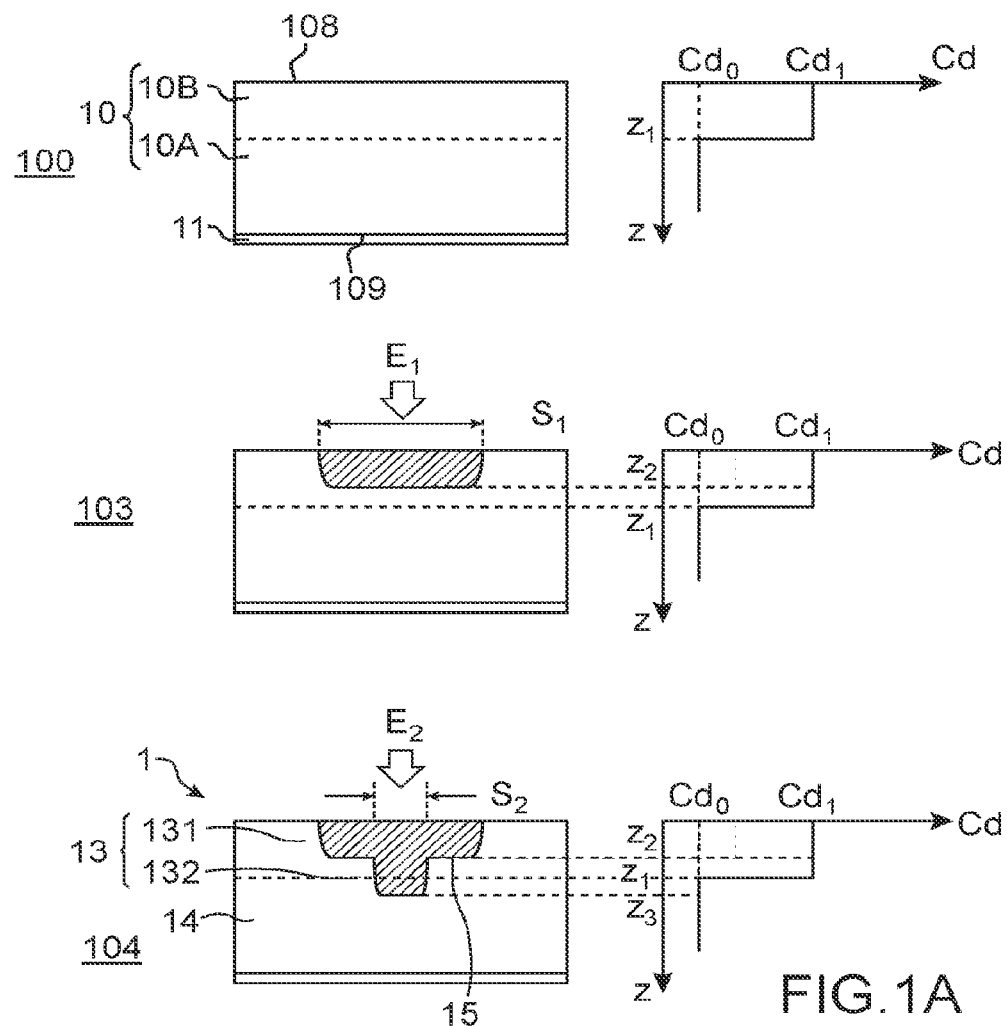
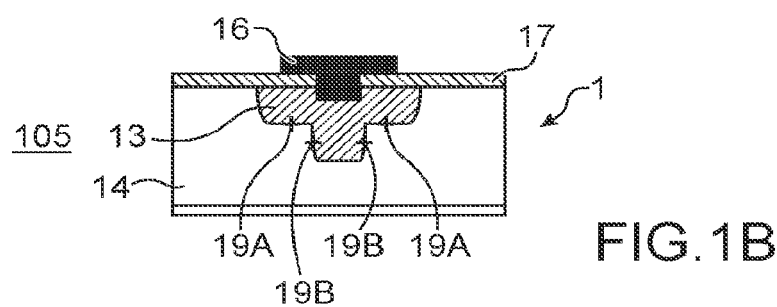
FIG.1A
FIG.1B

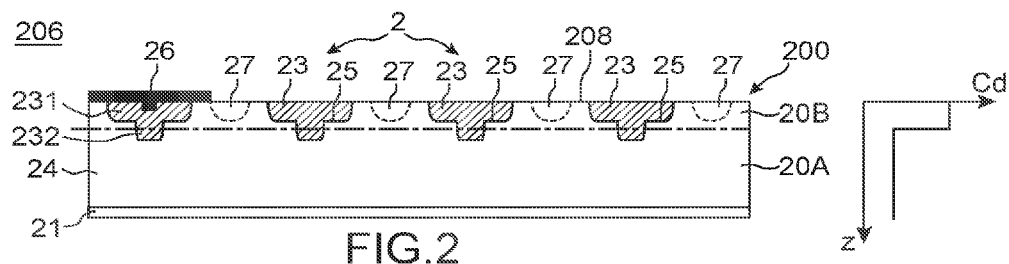
FIG.2
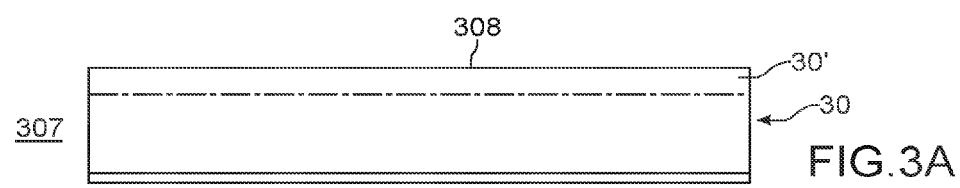
FIG.3A
FIG.3B
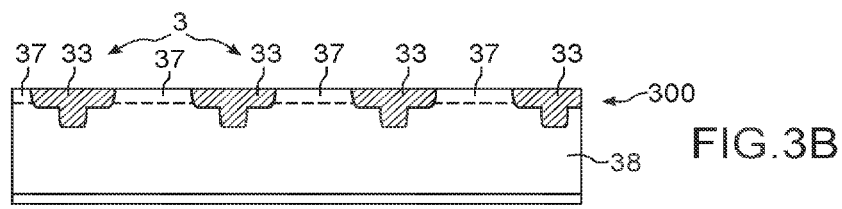
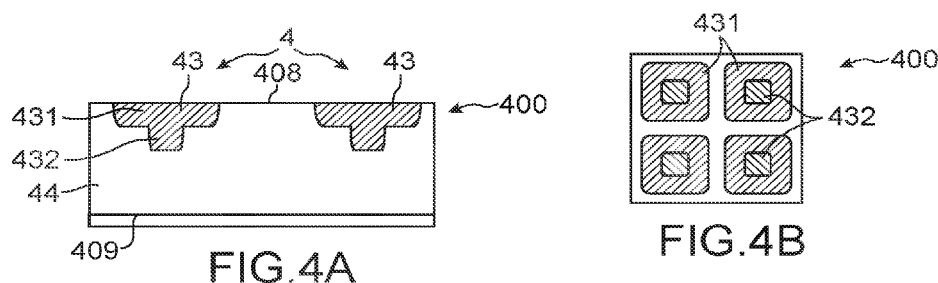
FIG.4A
FIG.4B
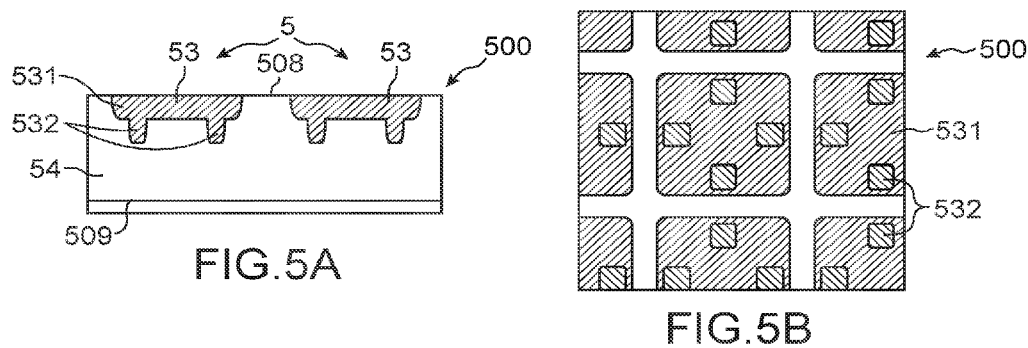
FIG.5A
FIG.5B

METHOD OF MANUFACTURING A LOW NOISE PHOTODIODE

TECHNICAL FIELD

The present invention relates to the field of methods of manufacturing a photodiode, used particularly for detecting infrared radiation.

STATE OF THE PRIOR ART

Different kinds of photodiodes are known in the prior art, which are used for example in the space domain, for the detection of infrared radiation, particularly the mid-infrared (wavelengths comprised between 4 µm and 5 µm), and the far infrared (wavelengths greater than 5 µm).

A photodiode comprises a layer made of semi-conductor material, in which a PN junction separates a first doped region from a second doped region, also called absorption region. Throughout the text, all this layer of semi-conductor material is designated "useful layer". A photon at the desired wavelength is absorbed in the absorption region, where it creates a so-called minority carrier. This minority carrier diffuses into the useful layer until reaching the PN junction, where it is going to be the source of a carrier recombination electrical current. The diffusion of minority carriers up to the PN junction is designated "collection by diffusion".

A photodiode generally has a so-called dark current, corresponding to an electrical current of recombination of carriers in the photodiode, not corresponding to the absorption of an electromagnetic radiation. The dark current corresponds to noise, and degrades the infrared detection performances.

A method of manufacturing a planar photodiode is known in the prior art, comprising the production of a useful layer consisting in an upper layer made of an alloy of cadmium mercury tellurium $Cd_yHg_{1-y}Te$, y=0.28, and a lower layer made of $Cd_xHg_{1-x}Te$, x=0.22. A PN junction plunging into the useful layer slightly more deeply than the upper layer is then produced. A low noise photodiode is thereby obtained making it possible to detect wavelengths in the far infrared. Such a photodiode is described in the article "*MBE HgCdTe Heterostructure p-on-n Planar Infrared Photodiodes*", J. M. Arias & al., Journal of Electronic Materials, Vol. 22, No. 8, 1993.

It has been shown that in a semi-conductor material made of $Cd_xHg_{1-x}Te$, the band gap, known as "gap", depends on the cadmium concentration. The higher this concentration, the bigger the gap. Thus, in the photodiode described by J. M. Arias & al., the upper layer with big gap makes it possible to reduce noise, whereas the lower layer with small gap makes it possible to detect a photon at the desired wavelength.

The energy diagram of a conventional PN junction corresponds to a valence band which regularly increases from the energy level corresponding to the N doping to the energy level corresponding to the P doping. In the case of a PN junction as described in the article of J. M. Arias & al., and when the PN junction plunges less deeply into the useful layer than the limit between the upper layer and the lower layer, the valence band has a different evolution. Its energy level begins by decreasing, due to the band gap gradient, at the interface between the lower layer and the upper layer. Then, this energy level increases to the energy level corresponding to the P doping. The decrease of the energy level of the valence band forms a potential barrier, which hinders the diffusion of minority carriers up to the PN junction.

A drawback of the photodiode as described by J. M. Arias & al. is thus that the positioning of the PN junction remains a delicate step.

if the PN junction plunges too deeply into the lower layer, it results in an increase in the noise of the photodiode;

if the PN junction does not emerge in the lower layer, the big gap of the upper layer forms a potential barrier which hinders the diffusion of minority carriers up to the PN junction. The collection by diffusion of the minority carriers will thus be hindered. Thus, the absorption of a photon will indeed form a minority carrier in the absorption region of the photodiode, but it will not be able to reach the PN junction, and thus will not be able to be the source of a current in the photodiode.

An objective of the present invention is to propose a method of manufacturing a low noise photodiode, not having the drawbacks of the prior art.

In particular, an aim of the present invention is to propose a particularly simple method of manufacturing a low noise photodiode.

The invention also relates to a photodiode which can be obtained by means of a method according to the invention.

DESCRIPTION OF THE INVENTION

This objective is attained with a method of manufacturing a photodiode comprising a useful layer made of a semi-conductor alloy, the useful layer having a band gap value which decreases from a first so-called upper face to an opposite so-called lower face, said method comprising a step of producing a first doped region situated in the useful layer and forming a PN junction with a second doped region of the useful layer, said production of a first doped region comprising:

a first doping step, so as to produce a base portion of the first doped region; and a second doping step, so as to produce at least one protuberance of the first doped region, said protuberance protruding from the base portion and in the direction of the lower face of the useful layer, such that the average band gap value in the protuberance is less than the average band gap value in the base portion.

According to a first embodiment, the first doping step comprises a first ion implantation implementing a first implantation energy and a first implantation surface; and the second doping step comprises a second ion implantation, implementing a second implantation energy and a second implantation surface, the second implantation energy being greater than the first implantation energy, and the second implantation surface being at least two times smaller than the first implantation surface.

According to a second embodiment, the first doping step comprises a diffusion of dopant, implementing a first diffusion surface; and the second doping step comprises an ion implantation implementing a second implantation surface, the second implantation surface being at least two times smaller than the first diffusion surface.

The invention also relates to a method of manufacturing an array of photodiodes, in which each photodiode is manufactured by a method of manufacturing as defined above, the several first doped regions being situated in a same useful layer and each forming a PN junction with a second doped region common to the photodiodes.

This method advantageously comprises a step of producing at least one so-called over-doped zone, situated in the second doped region and between two neighbouring PN junctions, the over-doped zone having a doping density greater than that of at least one so-called absorption zone situated in the second doped region and under each PN junction.

The over-doped zone is obtained for example during a growth by epitaxy of the useful layer, by production of an over-doped layer of the useful layer, flush with the upper face of the useful layer, and forming, after producing the first doped regions, the over-doped zone.

The invention also relates to a photodiode comprising a useful layer made of a semi-conductor alloy, the useful layer having:
- a band gap value which decreases from a first so-called upper face of the useful layer to an opposite so-called lower face, and
- a PN junction, between a first doped region and a second doped region surrounding the first doped region;

the first doped region comprising:
- a base portion; and
- at least one protuberance, protruding from the base portion and in the direction of the lower face of the useful layer, such that the average band gap value in the protuberance is less than the average band gap value in the base portion.

Advantageously, the protuberance:
- extends into the useful layer at least 1.2 times more deeply than the base portion and
- has a section in a plane parallel to the plane of the upper face of the useful layer, at least two times less than the section of the base portion in a plane parallel to the plane of the upper face of the useful layer.

According to a first embodiment, the useful layer consists of a lower useful layer having a first band gap value and an upper useful layer having a second band gap value greater than said first value, the base extending uniquely into the upper useful layer and the protuberance extending at least into the lower useful layer.

According to a second embodiment, the useful layer has a continuous variation of band gap value, said value decreasing from the upper face to the lower face of the useful layer.

The useful layer is for example made of a semi-conductor alloy of cadmium, mercury and tellurium of $Cd_xHg_{1-z}Te$ type, or a semi-conductor alloy of indium, gallium and arsenic of $In_xGa_{1-x}As$ type, or a semi-conductor alloy of indium, arsenic, antimony of $InAs_xSb_{1-x}$ type.

According to a first variant, the first doped region has a single protuberance positioned at the centre of the base portion.

According to a second variant, the first doped region has at least two protuberances situated in the periphery of the base portion.

The invention finally relates to an array of photodiodes in which the photodiodes are photodiodes as defined above, the several first doped regions being situated in a same useful layer and each forming a PN junction with a second doped region common to the photodiodes.

Advantageously, the second doped region comprises:
- at least one so-called absorption zone, situated under each PN junction; and
- at least one so-called over-doped zone, situated between two neighbouring PN junctions, and having a doping density greater than that of the absorption zone.

BRIEF DESCRIPTION OF THE DRAWINGS

The present invention will be better understood on reading the description of embodiment examples given for purely indicative purposes and in no way limiting, while referring to the appended drawings in which:

FIG. 1A schematically illustrates a first embodiment of method of manufacturing a photodiode according to the invention, FIG. 1B schematically illustrates a sectional view of the photodiode obtained by means of the method of FIG. 1A;

FIG. 2 schematically illustrates a step of a first embodiment of method of manufacturing an array of photodiodes according to the invention, and a sectional view of the array of photodiodes obtained;

FIG. 3A schematically illustrates a step of a second embodiment of method of manufacturing an array of photodiodes according to the invention;

FIG. 3B illustrates a sectional view of the array of photodiodes, obtained by means of the method of FIG. 3A;

FIGS. 4A and 4B schematically illustrate, according to a sectional view and top view, a third embodiment of an array of photodiodes according to the invention; and FIGS. 5A and 5B schematically illustrate, according to a sectional view and a top view, a fourth embodiment of an array of photodiodes according to the invention.

DETAILED DESCRIPTION OF PARTICULAR EMBODIMENTS

Figure 1C:
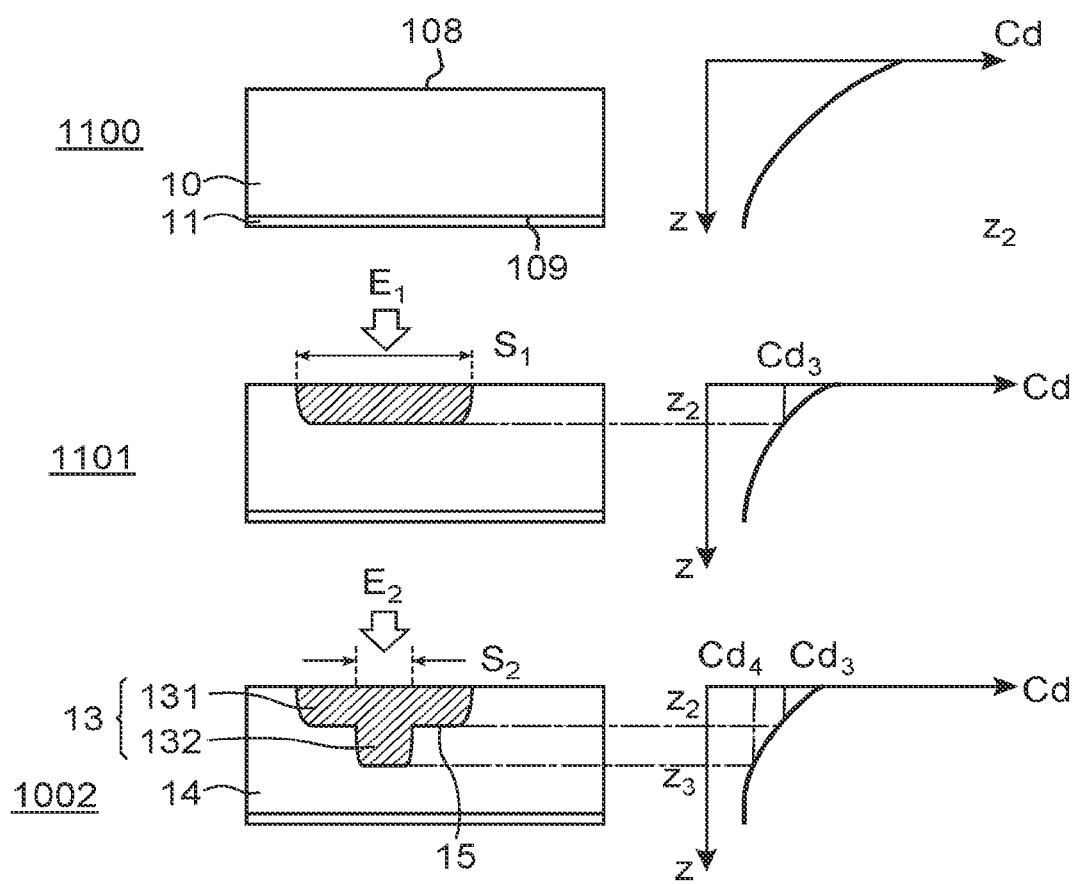
FIG. 1C illustrates a variant of the method of FIG. 1A.

The invention relates to a planar photodiode and method of manufacturing the same, as well as a planar array of such photodiodes. A planar photodiode (respectively a planar array of photodiodes) may be defined as having an upper layer made of semi-conductor material having a flat upper surface, without hole which is not entirely filled by an electrical connector.

FIG. 1A illustrates, schematically, the steps of a method according to the invention of photodiode manufacture. The views of FIG. 1A are sectional views.

Step 100:

The initial starting point is a so-called useful layer 10 made of semi-conductor material, for example made of an alloy of cadmium, mercury and tellurium $Cd_xHg_{1-x}Te$, with x a real number comprised between 0 and 1, excluding the limits.

In a variant, the useful layer 10 is made of semi-conductor material formed of an alloy of indium, gallium and arsenic $In_xGa_{1-x}As$, with x a real number comprised between 0 and 1, excluding the limits.

The useful layer 10 may also be made of semi-conductor material formed of an alloy of indium, arsenic and antimony $InAs_xSb_{1-x}$, with x a real number comprised between 0 and 1, excluding the limits.

In a semi-conductor material made of $Cd_xHg_{1-x}Te$ or $In_xGa_{1-x}As$ or $InAs_xSb_{1-x}$ or $In_{1-x}Al_xSb$ the band gap, designated "gap", depends on the cadmium, respectively indium, respectively arsenic, respectively aluminium concentration. Numerous variants could be imagined in which the useful layer 10 is formed of any semi-conductor alloy, in which the gap depends on the concentration of one of the components of the alloy.

The useful layer 10 typically has a thickness comprised between 3 µm and 20 µm, for example 6 µm.

This useful layer 10 is produced here on a substrate 11, transparent to the wavelengths that it is wished to detect. According to a variant not represented, the substrate is separated from the useful layer before, during or after the implementation of the method according to the invention.

For reasons of clarity of the figures, the thickness of the substrate 11 is under dimensioned in the figures.

The useful layer has for example a parallelepiped shape, particularly a parallelepiped rectangle shape. In this useful layer an axis z going from the face 108, connecting the faces 108 and 109, and defining the depth axis is defined. The face 109 is a lower face, here in contact with the substrate 11. The face 108 is an upper face, on the side opposite to the lower face 109.

The useful layer 10 has a band gap value gradient, said value decreasing from the upper face 108 to the lower face 109. This gradient of the band gap value here corresponds to a gradient of the cadmium concentration. It could be, depending on the case, a gradient of the concentration of indium in $In_xGa_{1-x}As$, or a gradient of a component in any other semi-conductor alloy, in which the band gap value depends on the concentration of said component in the alloy.

In the example illustrated in FIG. 1A, the gradient is discontinuous. In particular, the useful layer 10 consists of an upper useful layer 10B deposited directly on a lower useful layer 10A, the lower and upper useful layers each having a composition substantially constant in space. The upper useful layer 10B has a band gap value greater than that of the lower useful layer 10A. Such a useful layer is formed for example by varying the composition of a source material during the growth of the useful layer. This growth is particularly a growth by epitaxy.

It may be a molecular beam epitaxy. For example the lower useful layer 10A, then the upper useful layer 10B, are formed by modifying the composition of the elements deposited by epitaxy, particularly by modifying the concentration of a component of the useful layer determining its band gap value. An embodiment example of such a useful layer is described particularly in the article of J. M. Arias & al., presented in the introduction, as well as by Tennant & al. in the patent application US 2007/0034898. Here, the upper useful layer 10B thus has a cadmium concentration greater than the cadmium concentration in the lower useful layer 10A. On the right is represented the gradient of the cadmium concentration Cd as a function of the depth z in the useful layer.

For z comprised between 0 and $z_1$, the cadmium concentration takes a first value $Cd_1$. $z_1$ corresponds to the thickness of the upper useful layer 10A. For example $Cd_1$ is comprised between x=0.95 and x=0.5.

For z greater than $z_1$, the cadmium concentration takes a value $Cd_0$. For example $Cd_0$ is comprised between x=0.2 and x=4.

For example $Cd_1$ may be greater than or equal to $1.5*Cd_0$.

Step 101:

During step 101, a first ion implantation is carried out in the useful layer 10. This ion implantation implements an implantation energy $E_1$, and an implantation surface $S_1$. In other words, doping elements are sent into the useful layer with an energy $E_1$ and by making them pass through a surface $S_1$ of the upper face 108 of the useful layer.

The energy $E_1$ is here chosen such that a PN junction formed thanks to this ion implantation extends from the upper face 108 of the useful layer, and over a depth $z_2$ less than $z_1$.

On the right is represented the depth $z_2$ on the graph of the gradient of cadmium concentration in the useful layer. It may be seen that the cadmium concentration at the depth $z=z_2$ corresponds to the cadmium concentration $Cd_1$ in the upper useful layer.

Those skilled in the art will easily know how to define an energy value $E_1$, given that it is in no way necessary to be precise. In the example illustrated in FIG. 1A, as long as $z_2$ is less than $z_1$, the objective will be attained.

Step 102:

During step 102, a second ion implantation is carried out in the useful layer 10. This ion implantation implements an implantation energy $E_2$, and an implantation surface $S_2$.

The implantation energy $E_2$ is greater than the implantation energy $E_1$, such that the doping elements implanted at step 102 extend more deeply into the useful layer than the doping elements implanted at step 101. In particular, the energy $E_2$ is here selected such that a PN junction formed thanks to this ion implantation extends from the upper face 108 of the useful layer, and over a depth $z_3$ greater than $z_1$.

On the right is represented the depth $z_3$ on the graph of the gradient of cadmium concentration in the useful layer. It may be seen that the cadmium concentration at the depth $z=z_3$ corresponds to the cadmium concentration $Cd_0$ in the lower useful layer.

Those skilled in the art will easily know how to define an energy value $E_2$, given that it is in no way necessary to be precise. In the example illustrated in FIG. 1A, as long as $z_3$ is greater than $z_1$, the objective will be attained.

The implantation surface $S_2$ is more than two times smaller than the implantation surface $S_1$, such that the doping elements implanted at step 102 extend over a zone much narrower than the doping elements implanted at step 101. For example, the surface $S_1$ is a square with 10 μm sides, and the surface $S_2$ is a square with 1 μm sides.

The order between steps 101 and 102 may be changed. It may be provided to cover the upper face 108 with a resin, then insolating the resin by lithography so as to make therein a through opening of surface $S_1$, respectively $S_2$, through which the ion implantation is carried out.

Thanks to the doping elements implanted at steps 101 and 102, in the useful layer 10 is formed a first doped region 13 forming a PN junction 15 with a second doped region 14 of the useful layer. A PN junction 15 forms a photodiode.

A region is called P doped when it has an excess of "holes" (majority carrier), or in other words a lack of electrons (minority carriers). A region is called N doped when it has an excess of electrons (majority carrier), or in other words a lack of holes (minority carriers). The first doped region 13 is flush with the upper face 108, and has an N or P doping. The second doped region 14 has a P or N doping of different type, and surrounds the first doped region 13 laterally and on the side of the lower face 109.

The creation of a PN junction by ion implantation may implement, in a manner well known to those skilled in the art, additional steps of annealing and/or activation of the implanted doping elements.

For example, the first doped region 13 is produced by two successive implantations of arsenic (P dopant) in a useful layer made of $Cd_xHg_{1-x}Te$. In particular, two successive implantations of arsenic are carried out. An annealing is then carried out at around 400° C. to activate the arsenic. This annealing creates mercury vacancies throughout the useful layer 10. A strongly P doped region (thanks to the implantation of arsenic) and a weakly P doped region (due to the mercury vacancies) are thus obtained. The strongly P doped region forms the first doped region 13. An annealing is then carried out at around 200° C. under saturating mercury pressure to fill the mercury vacancies. The weakly P doped region becomes N doped, and forms the second doped region 14.

In a variant, the first doped region 13 is produced by two successive implantations of boron (N dopant) in a useful layer made of $Cd_xHg_{1-x}Te$. To do so, in a first step, an annealing is carried out to adjust the level of mercury vacancies, so as to P dope the whole of the useful layer. After the boron implantations, a first doped region 13, N doped, and a second doped region 14, P doped, are thus obtained.

Those skilled in the art will know how to implement the steps required to produce a PN junction by ion implantation in other materials such as $In_xGa_{1-x}As$ or $InAs_xSb_{1-x}$.

According to the invention, the first doped region 13 has:
- a base portion 131, produced thanks to the first doping step 101; and
- a protuberance 132, protruding from the base portion 131 and in the direction of the lower face 109.

The average band gap value in the protuberance 132 is less than the average band gap value in the base portion 131.

In the embodiment represented in FIG. 1A, the band gap value exhibits a sudden break at the interface between the upper useful layer and the lower useful layer. In this case, the method according to the invention is implemented so that the base portion 131 is located entirely in the upper useful layer, and the protuberance 132 is located at least in part in the lower useful layer. The protuberance is located for example, over more than half of its volume, in the lower useful layer.

The section of the base portion 131 is defined as being its section in a plane parallel to the upper face 108, situated typically at mid-height between the upper face 108 and the maximum depth of the base portion 131. The section of the protuberance 132 is defined as being its section in a plane parallel to the upper face 108, situated typically at mid-height between the maximum depth of the base portion 131 and the maximum depth of the protuberance 132. Typically, the section of the base portion 131 is two times, or even four times and even ten times larger than the section of the protuberance 132. It is considered that the section of the base portion 131 corresponds to the implantation surface $S_1$, and the section of the protuberance corresponds to the implantation surface $S_2$.

According to a variant of the method according to the invention, the base portion 131 is produced by diffusion of doping elements. The protuberance 132 may also be produced by diffusion of doping elements, even though an ion implantation is preferred.

FIG. 1B illustrates the photodiode 1 obtained thanks to the method according to the invention. The photodiode 1 is represented according to a sectional view in a plane orthogonal to the plane of the upper face 108. In FIG. 1B, the first doped region 13 has a T shape, corresponding to a protuberance 132 protruding from the centre of the base portion 131.

It may be noted that a protuberance 132 corresponds on this sectional view by inflexion points on the section of the PN junction 15. An inflexion point corresponds to a change of sign of the radius of curvature, or in other words a change of concavity (curve going from the concave to convex type, or vice-versa). Two couples comprising an upper inflexion point 19A (on the side of the upper face 108) and a lower inflexion point 19B (on the side of the lower face 109) each frame a rounded angle formed between the base portion 131 and the protuberance 132.

It would be possible to produce an array of photodiodes according to the invention, from a useful layer in which several first doped regions 13 are formed, each forming a PN junction with a common second doped region 14.

The advantages of the implementation of the method according to the invention, and of the photodiode thereby obtained will now be explained.

The noise of a photodiode has various sources:
- the diffusion current, which may be greatly reduced by decreasing the temperature of use of the photodiode; and
- the generation-recombination current which decreases more slowly with temperature.

The generation-recombination current is thus the source of noise which determines the performances of a photodiode at low temperature.

The generation-recombination current comprises particularly the generation-recombination current of the depletion region. The depletion region extends near to the PN junction, and on either sides thereof. It is exempt of free carriers and constituted of two electrically charged zones.

The generation-recombination current of the depletion region is created by a spontaneous generation of an electron-hole pair in the depletion region, not corresponding to the absorption of a photon in the useful layer. Thus, a current not corresponding to the absorption of an incident photon is measured in the photodiode.

The generation-recombination current of the depletion region is proportional to the volume of the first doped region 13, and has an exponential dependency on the gap in the depletion region:

$$I_{GR} = I_0 V e^{\frac{-E_g}{2kT}} \quad (1)$$

with $I_{GR}$ the generation-recombination current of the depletion region, $I_0$ a constant, T the temperature, k Boltzmann constant, V the volume of the first doped region 13, and $E_g$ the gap in the depletion region.

It may thus be seen that to decrease the generation-recombination current of the depletion region, it is possible to decrease the volume V and/or to increase the gap in the depletion region.

If the value of the gap in the useful layer is exploited, it is necessary to maintain a small gap on the side of the lower face 109, at the spot where an incident photon at the desired wavelength is going to create a minority carrier in the useful layer. It is possible to maintain an infrared detection in a small gap material, on the side of the lower face 109, and to consign the depletion region into a larger gap material, on the side of the upper face 108. The generation-recombination noise is thus minimised in the depletion region (leakage currents), while detecting the desired wavelengths, particularly in the mid-infrared or the far-infrared.

As specified in the introduction, this characteristic alone has however as drawback that the positioning of the PN junction is delicate.

Yet, according to the invention, the first doped region 13 is produced by:
- a first doping step forming a base portion 131 which is going to be the source of a generation-recombination current of the depletion region $I_{GR1}$; and
- a second doping step forming a protuberance 132 which is going to be the source of a generation-recombination current of the depletion region $I_{GR2}$.

Thus, the total generation-recombination current of the depletion region is expressed thus:

$$I_{GR} = I_{GR1} + I_{GR2} = I_{01}V_1 e^{\frac{-E_{g1}}{2kT}} + I_{02}V_2 e^{\frac{-E_{g2}}{2kT}} \quad (2)$$

with T the temperature, k Boltzmann constant, $I_{01}$ and $I_{02}$ constants, $V_1$ the volume of the base portion 131, $V_2$ the volume of the protuberance 132, $E_{g1}$ the gap in the depletion region situated around the base portion 131 (here around a depth $z_1$ in the useful layer) and $E_{g2}$ the gap in the depletion region situated around the protuberance 132 (here around a depth $z_2$ in the useful layer).

The average band gap value $E_{g1}$ in the base portion 131 is greater than the average band gap value $E_{g2}$ in the protuberance 132.

The generation-recombination current of the depletion region has two contributions:
- $I_{GR1}$, the value of which depends on $V_1$ and $E_{g1}$. $E_{g1}$ is high which contributes to reducing the value of $I_{GR1}$.
- $I_{GR2}$, the value of which depends on $V_2$ and $E_{g2}$. $V_2$ is small which contributes to reducing the value of $I_{GR2}$.

Thus, the positioning of the PN junction does not pose any major constraints:
- the base portion 131 may be located entirely in a big gap zone, since it is not the part which collects the minority carriers.
- the minority carriers are collected thanks to the protuberance 132 which, since its volume is reduced, may be located entirely in a small gap zone while contributing only very slightly to the noise of the array of photodiodes. In other words, the low value of $V_2$ makes it possible to have a low value of $I_{GR2}$. Moreover, the low value of $E_{g2}$ avoids the formation of a potential barrier repelling the minority carriers at a distance from the PN junction 15.

In other words, a potential barrier repelling the minority carriers is pierced by the PN junction, at the level of the protuberance 132. Thanks to the partition of the first doped region 13 into two portions, the protuberance 132 extends clearly beyond this potential barrier, without harmful consequence on the noise of the photodiode. In other words, this piercing is clear cut: the PN junction does not only come flush with the potential barrier, but is placed clearly at a distance therefrom. This thus assures that the minority carriers are efficiently collected by the PN junction, at the level of the protuberance 132. The photodiode 1 according to the invention thus has a high quantum efficiency.

Moreover, when an array of photodiodes 1 is produced according to the invention, this clear cut piercing of the potential barrier by the PN junction assures a homogeneity of the quantum efficiency of the array. Such a homogeneity is difficult to attain with a PN junction flush with the potential barrier. In fact, the positioning of the PN junction along the axis z of the depth is difficult to control, and can thus vary from one photodiode to the next on a same array. This leads to disparate performances according to whether the PN junction is located just above the potential barrier or just below the potential barrier.

The invention thus offers a particularly simple method of manufacturing a planar photodiode 1, having both a low noise, and a high quantum efficiency.

The invention is particularly interesting in the case of a first P doped region 13, on a second N doped region 14.

It may be noted that the fact that the width of the PN junction accessible to the minority carriers is small relative to the width of the photodiode (respectively to the pitch of the array of photodiodes) is not problematic. If need be, it will be possible to provide a low doping density in the second doped region 14, in order to increase the diffusion length of the minority carriers in this region.

FIG. 1C illustrates a variant of the method of FIG. 1A. This embodiment will only be described for its differences relative to the embodiment of FIG. 1A.

Step 1100:

According to the embodiment of FIG. 1C, the useful layer initially has a band gap value gradient, the gap varying in a decreasing and continuous manner, from the upper face 108 of the useful layer to its lower face 109. This continuous variation corresponds for example to a variation of the band gap of less than 10%, over a thickness of the useful layer of around 100 nm.

Such a gradient is for example produced during the growth by epitaxy of the useful layer, by continually varying the composition of the source material.

The band gap value gradient here corresponds to a gradient of cadmium concentration as represented on the right. The cadmium concentration in the useful layer decreases for example, from x=0.95 up to x=0.2.

Steps 1101 and 1102 correspond respectively to steps 101 and 102 described with reference to FIG. 1A. However, the selection of the implantation energies $E_1$ and $E_2$ has even fewer constraints. In fact, since the value of the band gap decreases continuously from the upper face 108 to the lower face 109, it suffices that $E_2$ is greater than $E_1$ in order that the average band gap value in the protuberance is necessarily less than the average band gap value in the base portion. No precaution is necessary to obtain this result. This variant is thus particularly advantageous.

The depth of the base portion 131 is defined as being its maximum depth in the useful layer. The depth of the protuberance 132 is defined as being its maximum depth in the useful layer. Typically, the protuberance 132 extends more deeply from 0.2 to 0.5 μm into the useful layer. The protuberance 132 extends for example one third more deeply into the useful layer than the base portion 131, thanks to an implantation energy $E_2$ two to five times higher than $E_1$. The implantation energy $E_2$ is for example of the order of 50 to 500 keV, for an implantation of arsenic.

The following criteria may be considered:
- the protuberance 132 must extend into the useful layer down to a depth where the gap is such that the difference between said gap and the minimum gap in the useful layer is less than kT where k is Boltzmann constant. In other words: $Eg(Cd_2)-Eg(Cd_0)<kT$, particularly $Eg(Cd_2)-Eg(Cd_0)<0.8*kT$; and
- the base portion 131 must extend into the useful layer to as shallow a depth as possible, where the gap is such that the difference between this gap and the minimum gap in the useful layer is greater than kT. In other words: $Eg(Cd_1)-Eg(Cd_0)>kT$, particularly $Eg(Cd_1)-Eg(Cd_0)>1.2*kT$.

In fact, the blocking character of the potential barrier is linked to the ratio $\Delta E_g/kT$ with $k=8.6 \cdot 10^{-5}$ eV/K. Experimentally, the inventors have noted that $\Delta E_g \approx kT$ is the limit gap difference above which the photo-carriers are blocked. In particular, the inventors have noted that for a potential barrier height estimated at $\Delta E_g=6$ to 8 meV, the blocking of the photo-carriers takes place from T<70 K, which corresponds to $\Delta E_g \approx kT$.

This embodiment of the invention is particularly advantageous for a use of a photodiode at low temperature (for example a temperature less than 70 K), since at these temperatures the minority carriers lack energy to pass through a possible potential barrier before accessing the PN junction. Thus, it is advantageous to further reduce the potential barrier to pass through, thanks to the protuberance 132.

The method according to the invention may be followed by conventional steps of installation of electrical contact elements. In particular, an electrical contact element 16 may be installed in contact with the first doped region 13. The electrical contact element 16 makes it possible to electrically polarize the photodiode. The electrical contact element 16 is typically produced by an etching in the first doped region 13 then deposition of a contact point metal. The etching may pass through a potential passivation layer 17 covering the useful layer 10. Typically, the electrical contact 16 has a minimum diameter of 4 µm, in its part in contact with the first doped region 13. The first doped region 13 thus has, at the level of the upper face 108, a minimum width of 6 µm.

It is also possible to provide (not represented), an electrical contact element installed in contact with the second doped region 14, and which may be common to all the photodiodes of an array of photodiodes.

As described above, the contribution to the noise of the base portion 131 depends on $V_1$ and $Eg_1$. Thanks to the invention, it is possible to position the base portion 131 entirely in a zone with big gap. It is thus possible to resort to large values of $V_1$ without dramatic consequences on the noise of the array of photodiodes. Large values of $V_1$ may correspond to a large section of the first doped region 13 on the side of the upper face 108. This facilitates the positioning of the electrical contact element 16, in contact with the first doped region 13. The invention is thus particularly advantageous in the framework of the manufacture of photodiodes and arrays of photodiodes of small dimensions, particularly planar arrays of photodiodes of pitch less than or equal to 15 µm.

It may be noted that the etching of an electrical contact point can form a small N doped zone at the level of the etching. It is thus crucial to position the electrical contact element 16 in contact with the first doped region 13, particularly when it is P doped, in order to avoid short-circuits of the PN junction.

In the prior art, conduction channels may appear, on the surface, between neighbouring PN junctions, thus joining together one or more pixels of the array of photodiodes. These conduction channels may be formed by imperfections of a passivation layer deposited on the upper face 108 of the useful layer. These conduction channels appear more particularly when the useful layer has a small gap, and are more problematic when two neighbouring PN junctions are close (small array pitch). Yet, according to the invention:
  the portions of PN junctions situated in a small gap material may be distant from each other (protuberance); and
  the portions of PN junctions close to each other may be located in a big gap material (base portion).

An array of photodiodes with small pitch, and in which neighbouring pixels do not meet, is thus easily produced. The invention is particularly advantageous in the case of arrays of photodiodes of large dimensions, for example arrays of 640×512 photodiodes.

In certain cases, the big gap at the surface is not sufficient to be free of conduction channels, at the surface. A solution making it possible to be free all the same of conduction channels at the surface will be detailed hereafter.

In FIG. 2 is represented a step 206 of a first embodiment of the method according to the invention, making it possible to produce an array 200 of photodiodes 2 according to the invention. The numerical references 2, 21, 20A, 20B, 23, 24, 25, 231, 232 of FIG. 2, correspond to the numerical references 1, 11, 10A, 10B, 13, 14, 15, 131, 132 of FIG. 1A.

The second embodiment according to the invention comprises the steps of the method as illustrated in FIG. 1A, implemented to form each photodiode of the array of photodiodes. These steps are followed by step 206.

The useful layer thus consists of a lower useful layer 20A and an upper useful layer 20B. Each first doped region 23 according to the invention is composed of a base portion 231 situated in the upper useful layer 20B, and a protuberance 232 situated in the lower useful layer 20A.

In a variant, step 206 is carried out following the implementation of the steps of the method as illustrated in FIG. 1C, to form each photodiode of the array of photodiodes.

This step is here implemented following the production of several first doped regions 23, each forming a PN junction with a common second doped region.

During step 206, several over-doped zones 27 are produced, situated between two neighbouring PN junctions 25, in the second doped region. The over-doped zones 27 are flush with the upper face 208 of the useful layer.

The doping of the over-doped zones 27 is of the same type as that of the common second doped region. The over-doped zones 27 have a doping density greater than the doping density in the rest of the second doped region. In other words, the over-doped zones 27 have a doping density greater than the doping density in a so-called absorption zone 28 situated in the second doped region, particularly under each PN junction. For example, the doping density of the over-doped zones 27 is at least ten times greater than the doping density of the absorption zone 28. Typically, the doping density is $10^{16}$ atoms/cm$^3$ in the over-doped zones 27, and $10^{15}$ atoms/cm$^3$ in the absorption zone 28.

The over-doped zones 27 may be produced by ion implantation between two neighbouring PN junctions 25.

The over-doped zones 27 may extend rectilinearly between the PN junctions, and form a regular mesh. The over-doped zones 27 thus form conductive lines, which decreases the load effects which are the source of conduction channels, at the surface.

These conductive lines are advantageously electrically connected to an electrical polarisation contact of the second doped region. Thus, the resistance perceived by a photodiode distant from this electrical contact is decreased. This thus makes it possible to be free of difficulties linked to the depolarisation of central photodiodes in arrays of photodiodes of large dimensions. This thus avoids having to implant intermediate electrical contacts in the second doped region, and between PN junctions. This characteristic is particularly advantageous for small array pitches (less than 15 µm, for example 12 µm or 10 µm), and/or when the second doped region is P doped (not very mobile majority carriers).

Since the over-doped zones 27 and the first doped regions 23 are neighbouring in a part of the useful layer having a big gap, this does away with any potential tunnel effect between the over-doped zones 27 and the first doped regions 23.

The over-doped zones 27 may extend deeply into the useful layer, but it is preferred that they extend at the most over the same depth as the base portions 231 of the first doped regions 23.

It is possible to use electrical contacts 26 plunged into the first doped regions 23, to produce a mask through which the ion implantation forming the over-doped zones 27 is carried out. In FIG. 2, a single electrical contact 26 is represented, for the sake of clarity of the figure.

The presence of the over-doped zones 27 makes it possible to resort to low doping densities in the second doped region, for example N doped. This gives access to big diffusion lengths of the minority carriers in this region and assures that all the minority carriers are collected only by the portions of the PN junctions corresponding to the protuberances. For example, the doping density in the second doped region is $10^{15}$ atoms/cm$^3$, i.e. a diffusion length of the minority carriers of around 20 μm.

FIG. 3A schematically illustrates a step 307 of a second embodiment of method according to the invention for manufacturing an array of photodiodes.

This step 307 is here implemented before the production of several first doped regions 33, each forming a PN junction with a common second doped region 38.

During step 307, an over-doped layer 30' of the useful layer is produced, having a higher concentration of doping elements than that of the useful layer 30. The over-doped layer 30' is situated on the side of the upper face 308 of the useful layer 30. It is formed for example by inserting doping elements in the elements that are used for the growth by epitaxy of the useful layer 30. For example, indium is incorporated during the growth of a useful layer made of $Cd_xHg_{1-x}Te$, which will then correspond to a high N doping density.

The useful layer 30 may comprise an upper useful layer and a lower useful layer, each having a different band gap value. In this case, the over-doped layer 30' forms part of the upper useful layer. The thickness of the over-doped layer 30' is thus less than the thickness of the upper useful layer, for example two times less.

The useful layer may have a continuous variation of band gap value. The over-doped layer 30' forms part of such a useful layer, and thus also has a continuous variation of band gap value. The thickness of the over-doped layer 30' is low compared to the total thickness of the useful layer, for example at least four times lower.

Thus, after having produced the first doped regions 33, and possibly activated the doping elements in the over-doped layer 30', an array 300 as represented in FIG. 3B is obtained. The numerical references 300, 33, 3, 37 of FIG. 3B, correspond to the numerical references 200, 23, 2, 27 of FIG. 2.

The over-doped zones 37 are adjacent to the first doped regions 33. They correspond to the portions of the over-doped layer 30' not receiving a first doped region 33.

Preferably, the thickness of the over-doped zones 37 is less than or equal to the thickness of the base portion in each first doped region 33.

It is possible to produce over-doped zones 37 adjacent to the first doped regions 33, without degrading the optical performances of the array 300 of photodiodes 3, thanks to a sufficiently large gap in the useful layer over the whole depth corresponding to these over-doped zones 37. This characteristic is made possible thanks to the production in two parts of the first doped regions 33: this big gap is produced over the whole depth corresponding to these over-doped zones 37, and the protuberances according to the invention extend down to a depth in the useful layer where the gap is smaller.

FIGS. 4A and 4B schematically illustrate, according to a sectional view and respectively a top view, a third embodiment of an array 400 of photodiodes 4 according to the invention.

According to this embodiment, each first doped region 43 has a single protuberance 432, which is positioned centrally relative to the base portion 431 and which extends into a second doped region 44. As described with reference to FIG. 1, each first doped region 43 has a T shape, according to a sectional view in a plane orthogonal to the upper face 408 of the useful layer.

FIGS. 5A and 5B schematically illustrate, according to a sectional view and respectively a top view, a fourth embodiment of an array 500 of photodiodes 5 according to the invention.

According to this embodiment, each first doped region 53 has four protuberances 532, positioned in the periphery relative to the base portion 531. In particular, according to a top view, each base portion 531 has a square shape, and the protuberances 532 are positioned at the middle of each side of the square. Thus, two protuberances 532 of two neighbouring first doped regions 53 are close to each other.

It has been noted that the MTF of the array of photodiodes is better when the protuberances 532 of neighbouring first doped regions are close to each other. Although surprising, this observation can be explained by the fact that the probability that a minority carrier is collected by a PN junction A and is not collected by the neighbouring PN junction B varies all the more rapidly in space as the PN junctions A and B are close to each other.

By producing several protuberances 532 in a same first doped region 53, it is possible both to decrease the noise by reducing the total lateral extent of the protuberances 532, and to improve the MTF by arranging each protuberance 532 near to a protuberance 532 belonging to a neighbouring first doped region.

It may be noted that the use of several protuberances 532 further makes it possible to assure that all the minority carriers are collected, even if their diffusion length were too low relative to the pitch of the array and to the lateral extent of a single protuberance 532. This could be the case if it was decided to increase the doping density (for example to $10^{16}$ atoms/cm$^3$) throughout the whole second doped region 54, for example to combat against conduction channels. In this case, the diffusion length of the minority carriers would be reduced, hence a very good MTF but difficulties in collecting all the minority carriers for a too high array pitch and by means of a single protuberance 532 in each first doped region 53.

The invention claimed is:

1. A method of manufacturing a photodiode comprising a useful layer made of a semi-conductor alloy, the useful layer having a band gap value which decreases from a first upper face to an opposite lower face, said method comprising:
   producing a first doped region situated in the useful layer and forming a PN junction with a second doped region of the useful layer, said producing a first doped region comprising:
   a first doping step, so as to produce a base portion of the first doped region; and
   a second doping step, so as to produce at least one protuberance of the first doped region, said protuberance protruding from the base portion and in the direction of the lower face of the useful layer, wherein the average band gap value in the protuberance is less than the average band gap value in the base portion, wherein the first doping step comprises a first ion implantation implementing a first implantation energy and a first implantation surface; and the second doping step comprises a second ion implantation implementing a second implantation energy and a second implantation surface, the second implantation energy being greater than the first implantation energy, and the second implantation surface being at least two times smaller than the first implantation surface.

2. A method of manufacturing a photodiode comprising a useful layer made of a semi-conductor alloy, the useful layer having a band gap value which decreases from a first upper face to an opposite lower face, said method comprising:

producing a first doped region situated in the useful layer and forming a PN junction with a second doped region of the useful layer, said producing a first doped region comprising:

a first doping step, so as to produce a base portion of the first doped region; and a second doping step, so as to produce at least one protuberance of the first doped region, said protuberance protruding from the base portion and in the direction of the lower face of the useful layer, wherein the average band gap value in the protuberance is less than the average band gap value in the base portion, wherein:

the first doping step comprises a diffusion of dopant, implementing a first diffusion surface; and the second doping step comprises an ion implantation implementing a second implantation surface, the second implantation surface being at least two times smaller than the first diffusion surface.

3. A method of manufacturing an array of photodiodes, wherein each photodiode, has a useful layer made of a semi-conductor alloy, the useful layer having a band gap value which decreases from a first upper face to an opposite lower face, and each photodiode is manufactured by a method comprising:

producing a first doped region situated in the useful layer and forming a PN junction with a second doped region of the useful layer, wherein said producing a first doped region comprises a first doping step, so as to produce a base portion of the first doped region; and a second doping step, so as to produce at least one protuberance of the first doped region, said protuberance protruding from the base portion and in the direction of the lower face of the useful layer, such that the average band gap value in the protuberance is less than the average band gap value in the base portion, and respective first doped regions of the photodiodes being situated in a same useful layer and each forming a PN junction with a second doped region common to the photodiodes.

4. The method of manufacturing an array of photodiodes according to claim 3, wherein a step of producing at least one over-doped zone, situated in the second doped region and between two neighbouring PN junctions, the over-doped zone having a doping density greater than that of at least one absorption zone situated in the second doped region and under each PN junction.

5. The method of manufacturing an array of photodiodes according to claim 4, wherein the over-doped zone is produced during a growth by epitaxy of the useful layer, by production of an over-doped layer of the useful layer, flush with the upper face of the useful layer, and forming, after production of the first doped regions, the over-doped zone.

6. A photodiode comprising a useful layer made of a semi-conductor alloy, the useful layer having:

a band gap value which decreases from a first upper face of the useful layer to an opposite lower face, and a PN junction, between a first doped region and a second doped region surrounding the first doped region;

wherein the first doped region comprises:

abuse portion; and at least one protuberance, protruding from the base portion and in the direction of the lower face of the useful layer, such that the average band gap value in the protuberance is less than the average band gap value in the base portion, wherein the at least one protuberance has a section in a plane parallel to the plane of the upper face of the useful layer, at least two times less than the section of the base portion in a plane parallel to the plane of the upper face of the useful layer.

7. The photodiode according to claim 6, wherein the at least one protuberance extends into the useful layer at least 1.2 times more deeply than the base portion.

8. The photodiode according to claim 6, wherein the useful layer comprises a lower useful layer having a first band gap value and an upper useful layer having a second band gap value greater than said first value, and in that the base portion extends exclusively into the upper useful layer and that the protuberance extends at least into the lower useful layer.

9. The photodiode according to claim 6, wherein the useful layer has a continuous variation of band gap value, said value decreasing from the upper face to the lower face of the useful layer.

10. The photodiode according to claim 6, wherein the useful layer comprises a semi-conductor alloy of cadmium, mercury and tellurium of $Cd_xHg_{1-x}Te$ type, or a semi-conductor alloy of indium, gallium and arsenic of $In_xGa_{1-x}As$ type, or a semi-conductor alloy of indium, arsenic, antimony of $InAs_xSb_{1-x}$ type.

11. The photodiode according to claim 6, wherein the first doped region has a single protuberance positioned at the centre of the base portion.

12. The photodiode according to claim 6, wherein the first doped region has at least two protuberances situated in a periphery of the base portion.

13. An array of photodiodes, wherein the photodiodes are photodiodes according to claim 6, respective first doped regions of the photodiodes being situated in a same useful layer and each forming a PN junction with a second doped region common to the photodiodes.

14. An array of photodiodes according to claim 13, wherein the second doped region comprises:

at least one absorption zone, situated under each PN junction; and at least one over-doped zone, situated between two neighbouring PN junctions, and having a doping density greater than that of the absorption zone.

* * * * *